United States Patent [19]

Bársony

[11] Patent Number: 4,679,307
[45] Date of Patent: Jul. 14, 1987

[54] METHOD OF MANUFACTURING A RECESSED GATE OF A SEMICONDUCTOR DEVICE

[75] Inventor: István Bársony, Hamamatsu, Japan

[73] Assignee: Research Development Corporation of Japan, Tokyo, Japan

[21] Appl. No.: 789,536

[22] Filed: Oct. 21, 1985

[30] Foreign Application Priority Data

Oct. 29, 1984 [JP] Japan .................. 59-225885

[51] Int. Cl.⁴ .............. H01L 21/22; H01L 21/265; H01L 21/302
[52] U.S. Cl. .................. 29/576 B; 29/571; 29/578; 29/579; 148/1.5; 148/175; 148/187
[58] Field of Search ............ 29/571, 576 B, 578, 29/579; 148/1.5, 187, 175

[56] References Cited

U.S. PATENT DOCUMENTS

| | | | |
|---|---|---|---|
| 4,403,396 | 9/1983 | Stein | 29/571 |
| 4,412,378 | 11/1983 | Shinada | 29/578 |
| 4,419,811 | 12/1983 | Rice | 29/571 |
| 4,517,730 | 5/1985 | Meignant | 29/571 |
| 4,561,168 | 12/1985 | Pitzer et al. | 29/571 |

*Primary Examiner*—Upendra Roy
*Attorney, Agent, or Firm*—Armstrong, Nikaido, Marmelstein & Kubovcik

[57] ABSTRACT

This invention relates to a method of manufacturing recessed gate type SIT, comprising the steps of recess etching of a high resistivity epitaxial layer on a semiconductor substrate serving as a drain or source, adding an impurity on the bottom to form a gate, and providing a surface main electrode on the surface of the high resistance epitaxial layer. When a gate region is cut by etching, a recessed part is produced to form a concave portion wider than an etching mask. This etching mask is used without modification as a mask at the time of doping by ion implantation. This not only enables to omit some steps but forms a surface main electrode portion and a gate region in a self-aligning fashion to obtain a static induction transistor which has a well controlled characteristic.

5 Claims, 14 Drawing Figures

FIG.2(d-1)

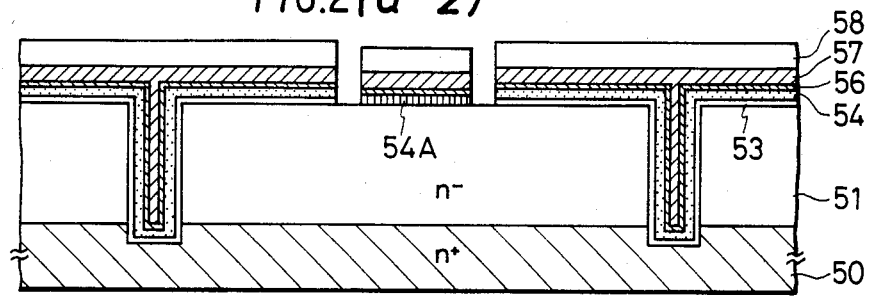
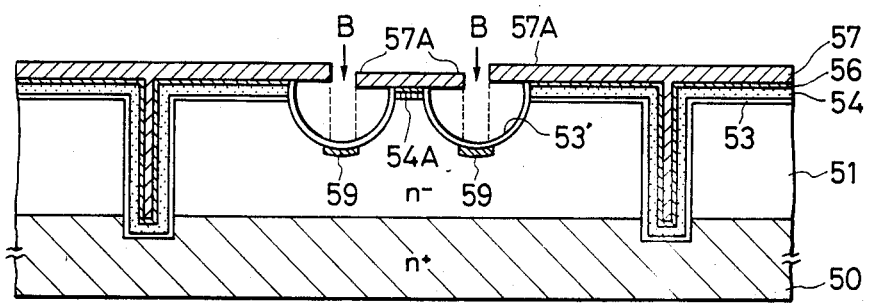
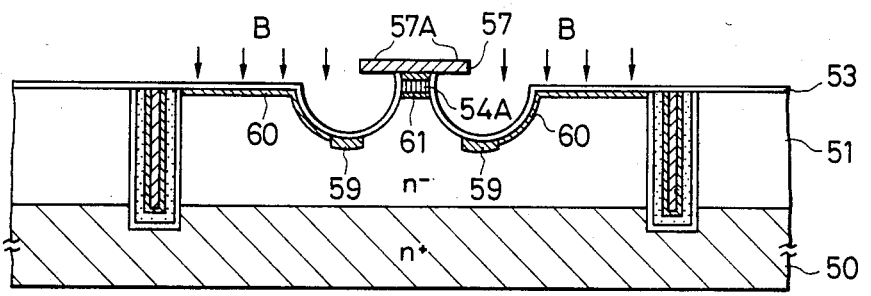
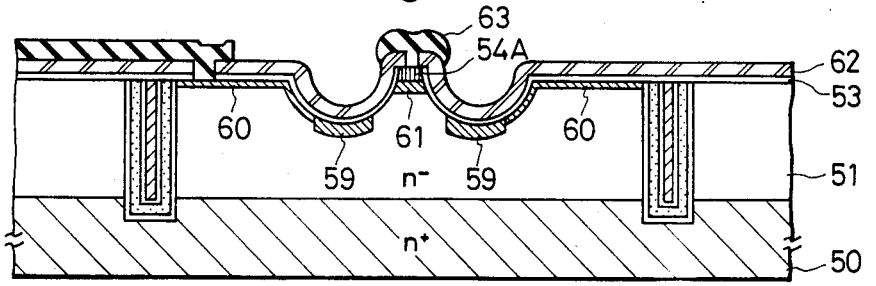

METHOD OF MANUFACTURING A RECESSED GATE OF A SEMICONDUCTOR DEVICE

BACKGROUND OF THE INVENTION

1. Field of the Invention

The present invention relates to a method of manufacturing a semiconductor device with an recessed gate structure, and more particularly to a method of manufacturing a static induction transistor (hereinafter referred to as "SIT") or a vertical field-effect transistor (hereinafter referred to as "Vertical FET").

2. Description of the Prior Art

A conventional gate structure of SIT includes a planar type wherein a gate region 3 is formed into the same plane as that of a surface main electrode 4 (source or drain) as shown in FIG. 3, and a buried gate type wherein a gate portion 13 is completely embedded into a high resistance epitaxial layer (channel region) 12 as shown in FIG. 4. The gate structure shown in FIG. 3 comprises a semiconductor substrate 1, a high resistivity epitaxial layer (channel region) 2, a gate Al electrode 5, a source (or drain) Al electode 6, and an insulating layer 7. In FIG. 4, reference numeral 11 denotes a semiconductor substrate (drain or source), 14 a surface main electrode (source or drain), 15 a gate Al electrode, 16 a source (or drain) Al electrode, 17 a buried gate connection portion and 18 an insulating layer.

The planar type SIT shown in FIG. 3 can be optimized and integrated similar to other planar type devices (such as bipolar, MOS etc.) and is applied to logic IC etc. which utilize high speeds thereof. However, a distance between the gate region 3 and the surface main electrode 4 secured is small in terms of structure and they are nearly overlapped. The junction of this kind has a high breakdown susceptibility and also the junction leak current is relatively high, thus posing a problem in terms of operating margin of the circuit, reliability, power consumption and the like.

On the other hand, in case of the buried type SIT shown in FIG. 4, it is necessary to have a distance large enough to prevent the buried gate portions 13 from being joined during the epitaxial growth, which makes optimization and integration difficult. Thus, this type of SIT is used as a discrete device such as a power transistor. A further disadvantage is that since the capacitance between the gate portion 13 and the surface main electrode 14 is large, it is difficult to operate at a high speed.

In order to overcome the drawbacks encountered in the aforesaid planar and buried gate type SITs, an recessed gate SIT as shown in FIG. 5 has been proposed. In this proposal, a high resistivity epitaxial layer (channel region) 32 is formed on a semiconductor substrate 31 serving as a drain or source, and thereafter recess-etching is applied thereto followed by addition of an impurity to the bottom to form a gate region 33. A surface main electrode (source or drain) region 34 is formed on the surface of the epitaxial layer 32 between the gates, and thereafter the surface is coated with an insulating layer 35. A gate Al electrode 36 and a source (or drain) electrode 37 connected to the gate region 33 and the surface main electrode region 34, respectively; are formed. According to the aforesaid recessed gate SIT, sufficient distance can be provided between the gate region 33 and the surface main electrode 34 of the structure, and therefore, the break-down susceptibility in this junction is low and also the junction leak current may be restricted to be low. In addition, since to some extent there is a freedom in positioning of the gate region 33 with respect to the channel region 32 between the main electrodes 31 and 34, this recessed gate SIT can be advantageously designed to have a larger voltage amplification constant, $\mu$ than that of the planar type.

However, in case of this recessed gate structure, it is difficult to form a gate electrode on the lower portion recessed by several $\mu m$ after etching. That is, it is naturally difficult to coat a photosensitive resin photoresist (normally, approximately $1\mu m$ of thickness) on the convex-concave surface uniformly. Very cumbersome means has to be used to overcome such difficultites, failing to realize putting it to practical use for these reasons.

SUMMARY OF THE INVENTION

It is therefore an object of the present invention to provide a method of manufacturing a semiconductor device which can easily form recessed gate structure while overcoming those problems noted above with respect to prior art.

A method of manufacturing a semiconductor device of recessed gate type according to the present invention is characterized in that side etching of produced by isotropic recess etching is utilized using a suitable pattern as a mask to form an undercut portion, and thereafter the same mask is used to add an impurity by ion implantation through the opening to form a gate.

More specifically, according to the characteristic feature of the present invention, in the step of manufacturing a SIT (or vertical FET) with a recessed gate, the following three steps as shown in FIG. 1 are effected. In FIG. 1, reference numeral 41 denotes a semiconductor substrate, 42 a high resistivity epitaxial layer, 43 a gate region, 44 a surface main electrode, 45 an undercut portion, and 46 a mask. In a first step, as shown in FIG. 1 (a), a desired pattern serving as a mask for gate recessing etching and a mask for implanting ions to form a gate is formed on a semiconductor substrate. In a second step, as shown in FIG. 1 (b), gate forming recess etching is effected using said the pattern as a mask. At this time, lateral etching (side etching) is utilized to form a concave portion on the semiconductor substrate as being wider by a predetermined size than the opening of a mask pattern formed in the first step. In a third step, as shown in FIG. 1 (c), at least one part of the pattern formed in the first step, namely, a pattern which determines one edge of the gate portion holding the surface main electrode (source or drain) is used, and an impurity is selectively added to the semiconductor substrate by ion implantation to form a gate region.

DETAILED DESCRIPTION OF THE PREFERRED EMBODIMENT

Figure 1A:
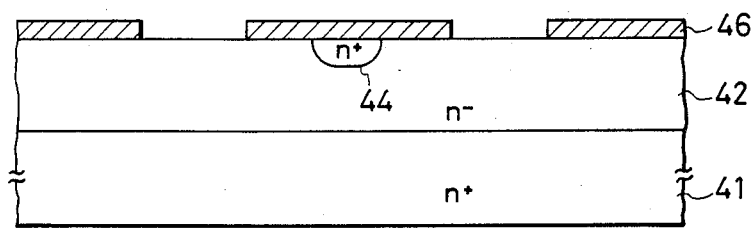
FIGS. 1 (a) to (c) illustrate the steps of manufacturing a semiconductor device showing the outline of the present invention.
Figure 1B:
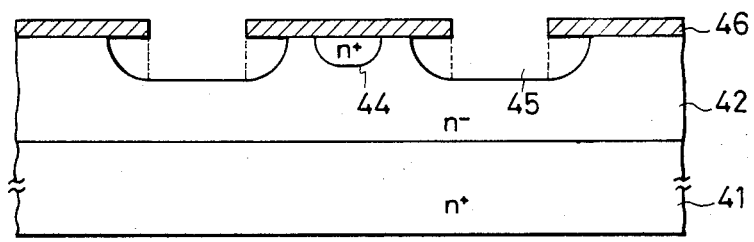
Figure 1C:
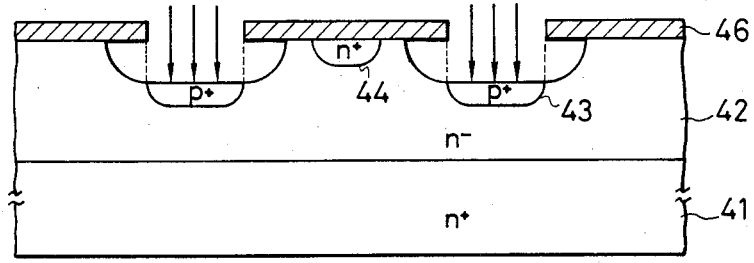
Figure 2A:
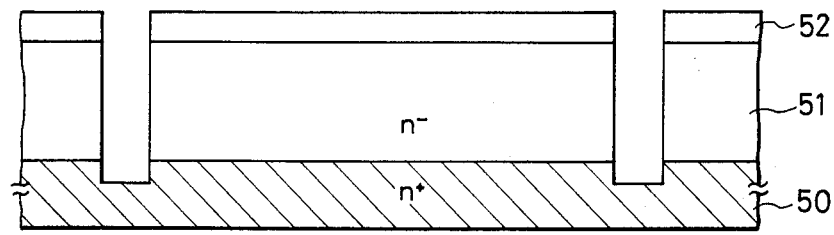
FIGS. 2 (a) to (g) illustrate the step of manufacturing a semiconductor device in accordance with one embodiment of the present invention.
Figure 2B:
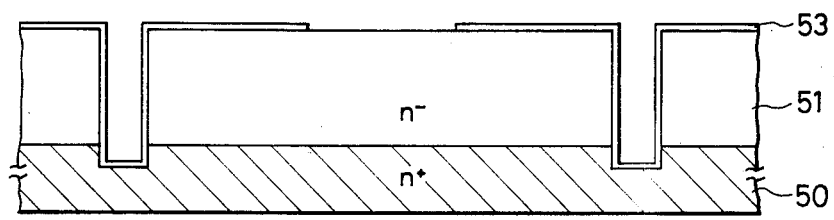
Figure 2C:
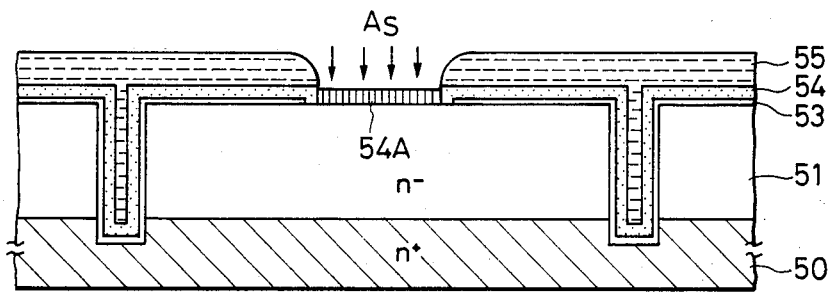

A method of manufacturing an undercut gate type SIT in accordance with one embodiment of the present invention will be described with reference to FIGS. 2(a) to 2(g).

FIG. 2 (a):

An $n^-$ high resistivity epitaxial layer 51 having 3-10 μm of thickness and $10^{14}$ cm$^{-3}$ or below of impurity concentration is formed on an $n^+$Si substrate having $10^{18}$ cm$^{-3}$ or above of impurity concentration. The Si substrate 50 is subjected to grooving etching to a portion deeper than an interface of $n^-$-$n^+$ by reactive ion etching (RIE) with $CCl_4$ or $CCl_2F_2$ using an $SiO_2$ film 52 processed to a predetermined pattern by photoetching. In this case, a vertical groove formation is attained which is almost free from lateral widening due to the anisotropy of etching.

FIG. 2 (b):

Subsequently, the $SiO_2$ film 52 is removed. The defects resulting from the reactive ion etching (RIE) are treated by groove cleaning. Thereafter, an $SiO_2$ film 53 is formed on the surface by thermal oxidation and only a portion forming the SIT is removed by photoetching.

FIG. 2 (c):

A non-doped polycrystalline Si film 54 having 0.3 to 1μm of thickness is formed by CVD (chemical vapor deposition). Implanting ions of $As^+$ is effected using a photoresist layer 55 subjected to patterning as a mask, and a doping region 54A is provided on a desired portion.

Figure 2C:
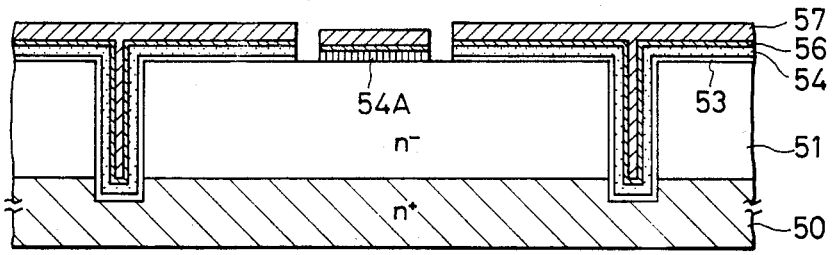
Figure 3:
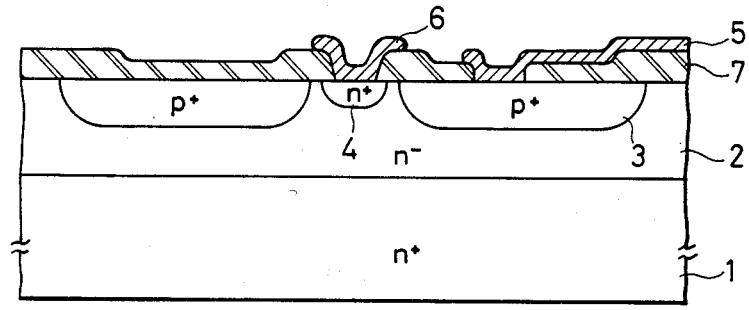
FIGS. 3 to 5 illustrate prior arts, FIG. 3 being a schematic sectional view of a planar type SIT, FIG. 4 a schematic sectional view of a buried gate type SIT, and FIG. 5 a schematic sectional view of an recessed gate type SIT.
Figure 4:
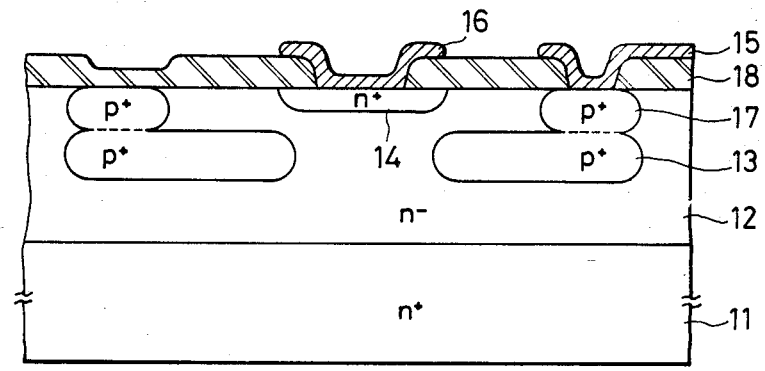
Figure 5:
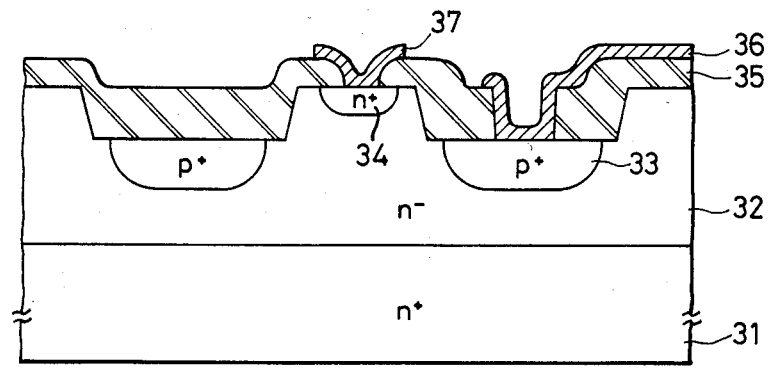

FIG. 2 (d):

Subsequently, the photoresist layer 55 is removed. A thin $SiO_2$ film 56 less than 1000 Å is formed by thermal oxidation, after which an $Si_3N_4$ film 57 having 0.2-0.5 μm of thickness is formed by CVD to completely fill the grooved portion. Then, in the step shown in FIG. 2 (e), an opening for forming a gate region of SIT by isotropic etching of Si is provided by applying photoetching thereto.

In this case, FIG. 2 (d-1) shows the structure of an opening required for wet etching using a solution of $CrO_3$—HF—$H_2O$. FIG. 2 (d-2) shows that $CVDSiO_2$ 58 is added to obtain a sufficient selectivity of etching with respect to isotropic plasma etching of Si using $CF_4$ gas or a combination of anisotropic Si RIE using $CCl_4$ or $CCl_2F_2$ used in the step shown in FIG. 2 (a) and isotropic Si plasma etching. In this case, deeper recessed areas may be formed and in addition, the lateral etching may be controlled. Therefore, it is possible to make precise etching.

FIG. 2 (e):

A desired recessed gate is provided by isotropic wet or Si plasma etching to form an overhang 57A structure of an $Si_3N_4$ film 57. After a thin thermally oxidized film 53' has been grown into the recessed portion to avoid channeling of implanted ions, ion-implantation of $B^+$ of $10^{14}$-$10^{15 cm-2}$ dose is effected with 50-100 Ke to form a gate 59. At that time, the gate 59 is formed only at the bottom of the recessed portion through the mask with the overhanging 57A edge of the $Si_3N_4$ film 57.

FIG. 2 (f)

The central part of the $Si_3N_4$ film 57 is coated with photoresist by photoetching, and the resulting coating is used as a mask whereby the other parts of the $Si_3N_4$ film 57, the non-doped poly-Si film 54 and the $SiO_2$ film 56 are completely removed by RIE using a mixture of $CF_4$—$H_2$ and $CCl_4$ or $CClF_2$ gas and again thermally oxidized to form a thin pad $SiO_2$ film 53 less than 1000 Å. By the heating applied this time, As is diffused from the doped region 54A to the epitaxial layer 51 to form an SIT source portion 61. Thereafter, implantation of $B^+$ ions is effected to form a gate 60 with a planar structure, which is connected to the recessed gate portion 59. Here, the overhang portion 57A of the $Si_3N_4$ film 57 causes an SIT source 61 and a gate portion 59 to form while they are maintained separated from each other.

FIG. 2 (g):

After removal of the central $Si_3N_4$ film 57, drive-in diffusion and thermal oxidation are effected to complete the gate portion 59 and the source portion 61 into a predetermined dimension thus obtaining a final SIT structure. Thereafter, a phospho silicate glass (PSG) 62 of 4000-7000 Å is formed by CVD in a conventional manner and subjected to reflow, after which a contact hole is opened and electrode wiring 63 with Al or the like takes place.

According to the method as described above, it is possible to extremely easily manufacture recessed gate type SIT having a precise controllability equal to or in excess of that of prior art planar structure and buried gate structure. Further-more, the surface main electrode portion and the gate portion may be formed in a self aligning fashion, and therefore, inhomogeneity in device characteristics can be minimized. Moreover, since the depth of pn junction of the gate portion can be minimized, a short-wave length sensitivity ($\lambda \leq 500$ nm) of several times the conventional one may be obtained in SIT photo-transistors and SIT image sensors which use a gate portion of SIT as a light detection electrode. The device having a high industrial value as being applied to photo-sensors may be obtained.

While in the above-described embodiment, the n channel SIT (Si) has been described, it should be of course noted that the device may also be applied to p channel SIT or vertical FET and other III-V group semiconductors etc.

As described above, according to the present invention, it is possible to extremely simply manufacture a semiconductor device with a recessed gate structure which can overcome demerits of a semiconductor device with a planar structure and a buried gate struture.

What is claimed is:

1. A method of manufacturing a semiconductor device with a recessed gate structure, the method comprises the steps of:

forming a thin film pattern of a predetermined material on a semiconductor substrate having a predetermined configuration;

selectively etching said semiconductor substrate using said film pattern as an etching mask to form a concave portion in said semiconductor substrate, said concave portion being wider than windows of said film pattern;

implanting ions of an appropriate impurity into a surface area of the bottom of said concave portion to form a recessed gate region, the implantation of said ions uses at least one part of said thin film pattern as a mask.

2. A method according to claim 1, wherein said selective etching is plasma etching using $CF_4$ gas.

3. A method according to claim 1 or 2, wherein before planting ions, a thin thermally oxidized film is formed on the surface of the concave portion.

4. A method according to claim 1, wherein the semiconductor device is an SIT (static induction transistor).

5. A method of manufacturing a semiconductor device with a recessed gate structure, the method comprises the steps of:
   forming a thin film pattern of a predetermined material on a semiconductor substrate having a predetermined configuration;
   selectively etching said semiconductor substrate using said film pattern as an etching mask to form a concave portion in said semiconductor substrate, said concave portion being wider than windows of said film pattern;
   implanting ions of an appropriate impurity into a surface area of the bottom of said concave portion to form a recessed gate region, the implantation of said ions uses at least one part of said thin film pattern as a mask;
   forming a source region on said film pattern; and
   forming a gate region on said film, said gate region being connected to said recessed gate region.

* * * * *